(12) United States Patent
Wang et al.

(10) Patent No.: US 7,639,551 B2
(45) Date of Patent: Dec. 29, 2009

(54) SENSE AMPLIFIERS OPERATED UNDER HAMMING DISTANCE METHODOLOGY

(75) Inventors: Chia-Wei Wang, Hsin-Chu (TW); Hong-Chen Cheng, Hsinchu (TW); Lee Cheng Hung, Hsinchu (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 251 days.

(21) Appl. No.: 11/737,093

(22) Filed: Apr. 18, 2007

(65) Prior Publication Data

US 2008/0258813 A1 Oct. 23, 2008

(51) Int. Cl.
*G11C 7/06* (2006.01)

(52) U.S. Cl. ............... 365/189.15; 365/189.08; 365/190; 365/208; 365/207; 365/205; 365/185.21; 365/185.2; 327/52; 327/57; 330/253; 330/252

(58) Field of Classification Search ............ 365/185.21, 365/185.2, 189.15, 189.08, 190, 205, 208, 365/207; 327/55, 54, 52, 57; 330/253, 252
See application file for complete search history.

(56) References Cited

U.S. PATENT DOCUMENTS

| | | | | |
|---|---|---|---|---|
| 4,748,594 | A | * | 5/1988 | Iida .......................... 365/200 |
| 6,105,161 | A | * | 8/2000 | Lee .......................... 714/777 |
| 7,209,391 | B2 | * | 4/2007 | Urabe et al. ........... 365/185.23 |
| 7,385,848 | B2 | * | 6/2008 | Iwata et al. ............ 365/185.21 |
| 2008/0258813 | A1 | * | 10/2008 | Wang et al. .................. 330/253 |

* cited by examiner

*Primary Examiner*—Andrew Q Tran
(74) *Attorney, Agent, or Firm*—K&L Gates LLP

(57) ABSTRACT

A semiconductor device includes a first sense amplifier coupled to an input for generating a first output; a second sense amplifier couple to the input for generating a second output; and a third sense amplifier coupled to the input for generating a third output, wherein a fourth output amplifying the input is generated based on combinations of logic states of the first, second and third outputs.

20 Claims, 4 Drawing Sheets

US 7,639,551 B2

SENSE AMPLIFIERS OPERATED UNDER HAMMING DISTANCE METHODOLOGY

BACKGROUND

The present invention relates generally to integrated circuit (IC) designs, and more particularly to sense amplifiers operated under Hamming distance methodology for improving performance or reducing layout areas thereof.

A differential amplifier is a circuit module that generates outputs in response to a voltage difference between various inputs. It is commonly used in IC chips, such as memory devices, for amplifying sensed data signals. The differential amplifier is typically consisted of electronic components that can be grouped into symmetric halves, each being connected to a differential input. The electronic components of the two symmetric halves need to match in their dimensions, materials and structures in order to ensure that the outputs from the differential amplifier accurately reflects the voltage difference between the inputs. As a result, the size of the differential amplifier cannot be scaled down easily because the smaller the amplifier the more susceptible it is to mismatch due to manufacturing process variations.

FIG. 1 illustrates a first distribution curve 102 of a first group of differential sense amplifiers and a second distribution curve 104 of a second group of differential sense amplifiers, which are half the size of the differential sense amplifiers in the first group. The offset voltages for each group of differential sense amplifiers are normally distributed, in which the curve 102 is more concentrated and the curve 104 is more spread out. The curves 102 and 104 show that there are more small amplifiers outside a predetermined range of input swing than the large ones. This raises reliability issues as the differential sense amplifiers are scaled down.

FIG. 2 illustrates a conventional differential sense amplifier within a layout area 202. A new design for differential sense amplifiers has been proposed to reduce the layout area without compromising their reliability. Naveen Verma, Anantha P. Chandrakasan, "A 65 nm 8T Sub-Vt SRAM Employing Sense-Amplifier Redundancy," IEEE International Solid-State Circuits Conference (ISSCC), pp. 64-65, February 2007. As shown in FIG. 3, the layout area 202 is split into two halves 302 and 304, each of which is implemented with a differential sense amplifier. Assume that the offset voltages for the large amplifier in the layout area 202 and the amplifier in the layout area 302 or 304 are normally distributed, and the probability of failure for the small amplifier is 0.001, which is translated into a z value of 3.09 in a standard normal distribution. The probability of failure for the large differential sense amplifier is therefore 0.000006, which is obtained by looking up the standard normal distribution table with a z value of 4.369, i.e., $3.09*(2)^{1/2}$ as the large amplifier is twice bigger than the small amplifier. Although the probability of failure for one small amplifier (0.001) is higher than that for one large amplifier (0.000006), the probability of two small amplifiers failing at the same time (0.000001=0.001*0.001) is lower than the probability of failure for one large amplifier. In other words, for the same reliability level, the overall size of two small amplifiers 302 and 304 would be smaller than one large amplifier 202.

The conventional dual sense amplifier design requires an initial testing process where all the sense amplifiers are scanned in order to select the sense amplifier with better performance from each pair of sense amplifiers. Additional registers are required for storing the status of the sense amplifiers in support of their operation. As a result, the conventional dual sense amplifier design can be quite complicated and resource-consuming.

Thus, what is needed is a simple design for differential sense amplifiers that reduces the layout areas without compromising the reliability.

SUMMARY

The present invention discloses a semiconductor device including a first sense amplifier coupled to an input for generating a first output; a second sense amplifier couple to the input for generating a second output; and a third sense amplifier coupled to the input for generating a third output, wherein a fourth output amplifying the input is generated based on combinations of logic states of the first, second and third outputs.

The construction and method of operation of the invention, however, together with additional objectives and advantages thereof will be best understood from the following description of specific embodiments when read in connection with the accompanying drawings.

DESCRIPTION

This invention describes a semiconductor device containing sense amplifiers operated under Hamming distance methodology for improving performance or reducing layout areas thereof. The following merely illustrates various embodiments of the present invention for purposes of explaining the principles thereof. It is understood that those skilled in the art will be able to devise various equivalents that, although not explicitly described herein, embody the principles of this invention.

Figure 2:
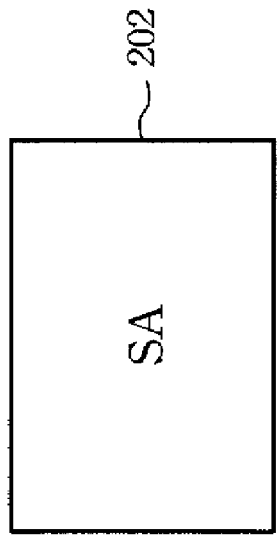
FIG. 2 illustrates a layout area in which a conventional differential sense amplifier is implemented.
Figure 3:
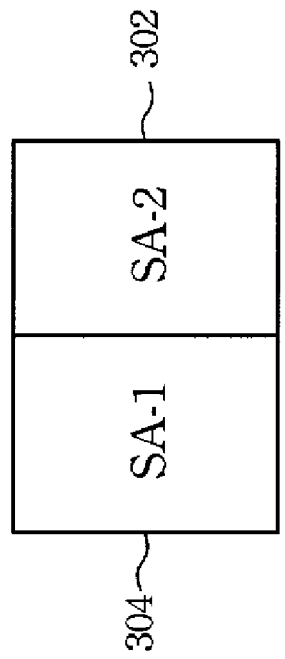
FIG. 3 illustrates a layout area in which conventional dual sense amplifiers are implemented.
Figure 1:
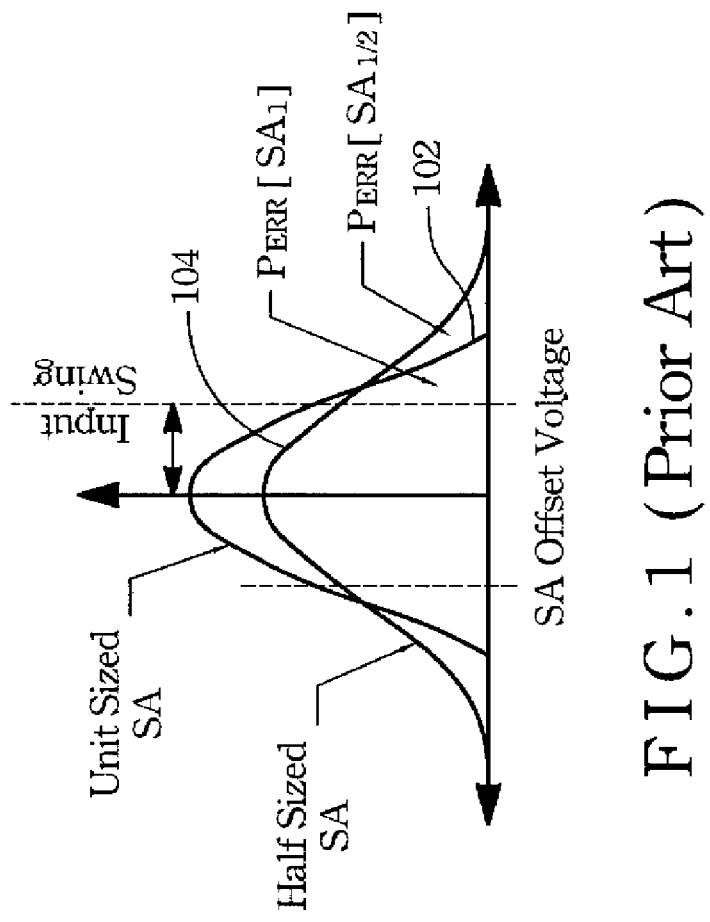
FIG. 1 illustrates graphs showing distributions of offset voltages for small and large differential sense amplifiers.
Figure 4:
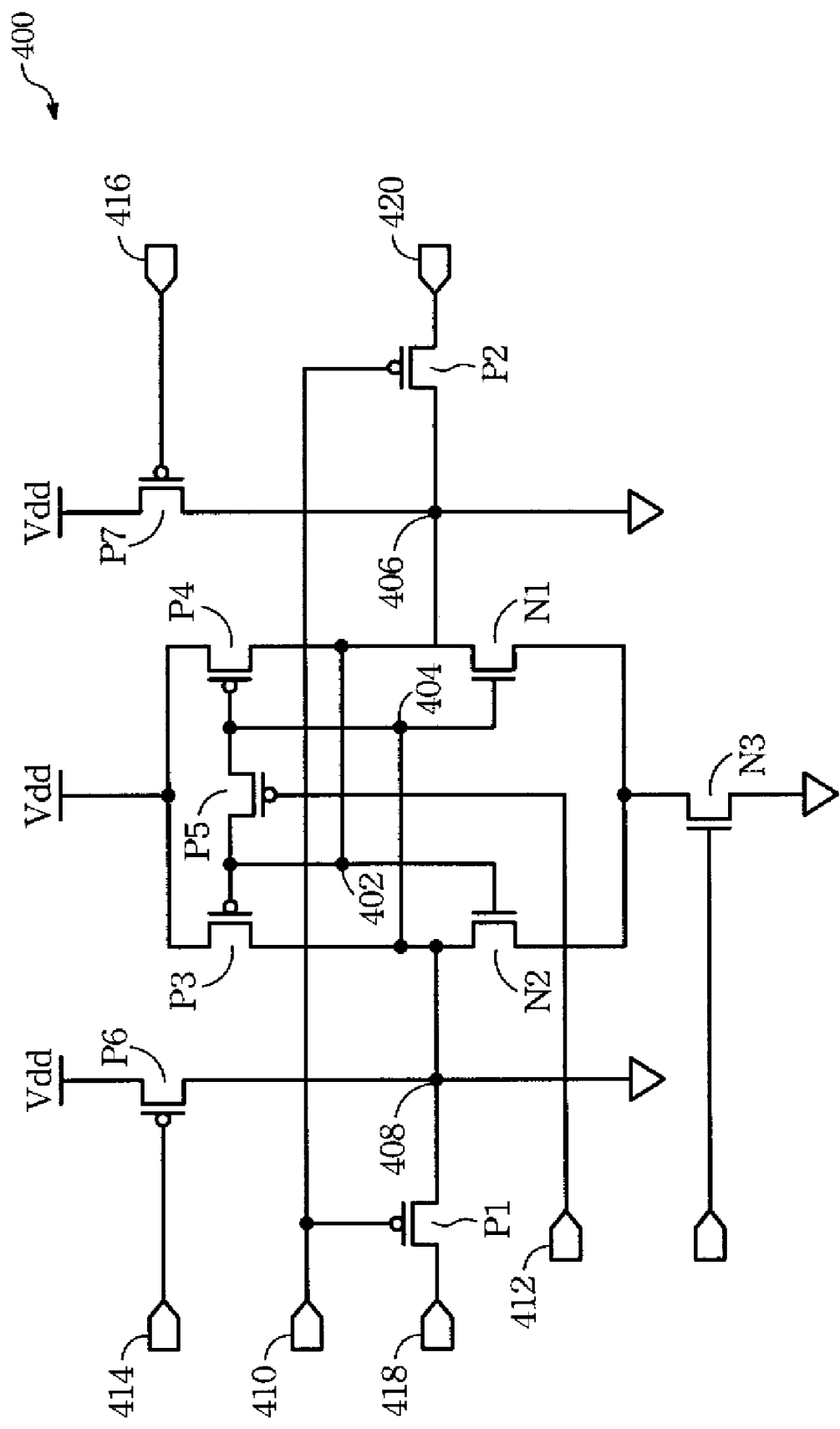
FIG. 4 illustrates a schematic of a differential sense amplifier in accordance with one embodiment of the present invention.

FIG. 4 illustrates a schematic of a differential sense amplifier 400 in accordance with one embodiment of the present invention. The differential sense amplifier 400 includes NMOS transistors N1, N2 and N3, PMOS transistors P1, P2, P3, P4, P5, P6 and P7. The PMOS transistors P3 and P4 are connected at their sources, which are further connected to the supply voltage Vdd. The drains of the PMOS transistors P3 and P4 are connected to the drains of the NMOS transistors N1 and N2, respectively. The sources of the NMOS transistors N1 and N2 are connected together with the drain of the NMOS transistor N3, which is further connected to ground or Vss at its source. The gates of the PMOS transistor P3 and the NMOS transistor N2 are connected together at a node 402, which is connected to the drains of the PMOS transistor P4 and the NMOS transistor N1. The gates of the PMOS transistor P4 and the NMOS transistor N1 are connected together at a node 404, which is connected to the drains of the PMOS transistor P3 and the NMOS transistor N2. The gates of the PMOS transistors P3 and P4 are connected via the PMOS transistor P5, which is controlled by an enable signal from a pad 412. The gates of the PMOS transistors P1 and P2 are controlled by a control signal from a pad 410.

Differential input signals from pads 418 and 420 are applied to the gates of the NMOS transistors N1 and N2, respectively. The voltage difference between the input signals are reflected by the currents on the two parallel paths of a current mirror constructed by the PMOS transistors P3 and P4, and the NMOS transistors N1 and N2, which in turn generates differential outputs at the pads of 408 and 406.

Table 1 below shows the sizes of electronic components in the differential sense amplifier 400 as they are manufactured by various generations of semiconductor processing technologies.

TABLE 1

|    | W/L (n90) | W/L (n65) | W/L (n45) |
|----|-----------|-----------|-----------|
| N1 | 2/0.2     | 2/0.18    | 2/0.175   |
| N2 | 2/0.2     | 2/0.18    | 2/0.175   |
| N3 | 1/0.15    | 2/0.08    | 2/0.042   |
| P1 | 1/0.15    | 1.2/0.1   | 0.52/0.07 |
| P2 | 1/0.15    | 1.2/0.1   | 0.52/0.07 |
| P3 | 1/0.2     | 1/0.12    | 0.52/0.12 |
| P4 | 1/0.2     | 1/0.12    | 0.52/0.12 |
| P5 | 1/0.1     | 1.2/0.12  | 0.52/0.12 |
| P6 | 1/0.1     | 1/0.1     | 0.52/0.07 |
| P7 | 1/0.1     | 1/0.1     | 0.52/0.07 |

As shown in table 1, the sizes of the NMOS transistors N1 and N2 do not shrink much as the semiconductor processing technology advances from n90 to n45. The reason is that the smaller the NMOS transistors the more susceptible they are to device mismatch due to manufacturing process variations. A serious device mismatch would cause the differential sense amplifier to fail.

Figure 5:
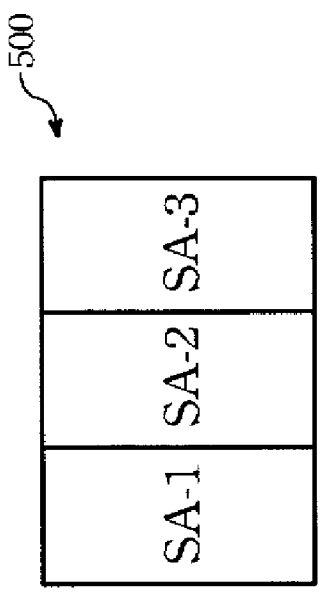
FIG. 5 illustrates a layout area in which a plurality of differential sense amplifiers operating under Hamming distance methodology are implemented in accordance with one embodiment of the present invention.

FIG. 5 illustrates a differential sense amplifier unit 500 in accordance with one embodiment of the present invention. The differential sense amplifier unit 500 is comprised of three differential sense amplifiers SA-1, SA-2 and SA-3, each of which can be designed as the schematic, for example, shown in FIG. 4. The three differential sense amplifiers SA-1, SA-2 and SA-3 can been seen as one unit that generates a single output reflecting an amplified input. The differential sense amplifiers SA-1, SA-2 and SA-3 operate under Hamming distance methodology, in which the Hamming distance between two strings of equal length is the number of positions for which the corresponding symbols are different. Table 2 below shows a truth table of the Hamming distance operation.

TABLE 2

| SA-1 | SA-2 | SA-3 | Total Number of "1s" | Total Number of "0s" | Hamming Output |
|------|------|------|----------------------|----------------------|----------------|
| 0    | 0    | 0    | 0                    | 3                    | 0              |
| 0    | 0    | 1    | 1                    | 2                    | 0              |
| 0    | 1    | 0    | 1                    | 2                    | 0              |
| 0    | 1    | 1    | 2                    | 1                    | 1              |
| 1    | 0    | 0    | 1                    | 2                    | 0              |
| 1    | 0    | 1    | 2                    | 1                    | 1              |
| 1    | 1    | 0    | 2                    | 1                    | 1              |
| 1    | 1    | 1    | 3                    | 0                    | 1              |

As shown in Table 2, each differential sense amplifier SA-1, SA-2 or SA-3 generates an output, and the Hamming output (the signal output of the unit 500) is determined based on combinations of the logic states of the outputs of the differential sense amplifiers SA-1, SA-2 and SA-3. Specifically, the output of the unit 500 is equal to the majority logic states of the outputs from the differential sense amplifiers SA-1, SA-2, and SA-3. For example, if the output of the differential sense amplifier SA-1 is "1," the output of the differential sense amplifier SA-2 is "1" and the output of the differential sense amplifier SA-3 is "0," the output of the unit 500 will be 1, whereas if the output of the differential sense amplifier SA-1 is "0," the output of the differential sense amplifier SA-2 is "0" and the output of the differential sense amplifier SA-3 is "1," the output of the unit 500 will be 0. The Hamming distance truth table can be expressed by the following equation: $Y = C*B + A*C + A*B + A*B*C$, where Y denotes the output of the unit 500, A the output of SA-1, B the output of SA-2, and C the output of SA-3.

Figure 6:
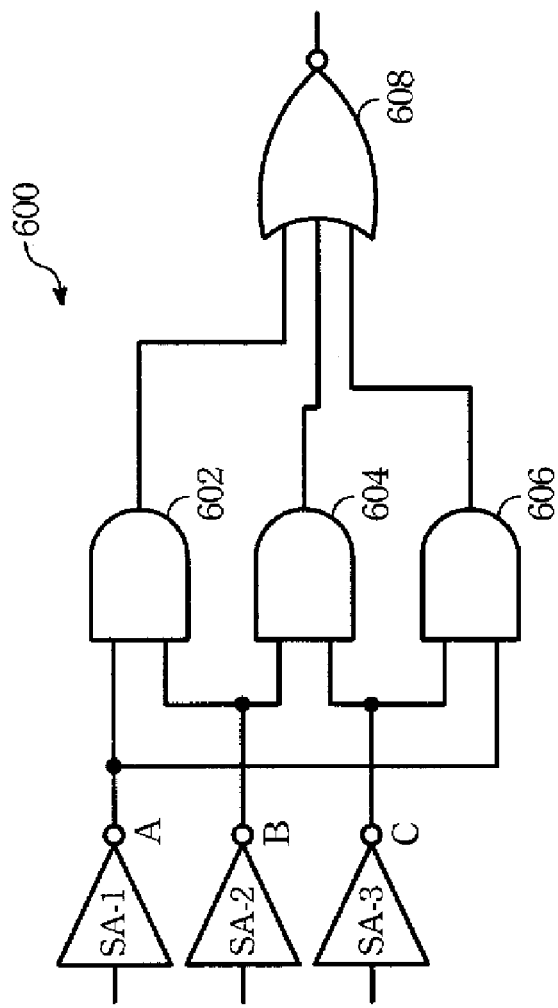
FIG. 6 illustrates a schematic of a Hamming operation circuit in accordance with one embodiment of the present invention.

FIG. 6 illustrates a schematic of a Hamming operation circuit 600 as an exemplar circuit implementation of the above-described three-amplifier Hamming distance operation. The circuit 600 is comprised of AND gates 602, 604 and 606, and an OR gate 608. The AND gate 602 has one input terminal coupled to an output A from the differential sense amplifier SA-1, and another coupled to an output B from the differential sense amplifier SA-2. The AND gate 604 has one input terminal coupled to the output B from the differential sense amplifier SA-2, and another coupled to an output C from the differential sense amplifier SA-3. The AND gate 606 has one input terminal coupled to the output C from the differential sense amplifier SA-3, and another coupled to the output A from the differential sense amplifier SA-1. The output terminals of the AND gates 602, 604 and 606 are coupled to the input terminals of the OR gate 608, which generates an output based on various combinations of the A, B and C in accordance with the above Hamming distance truth table.

Figure 7:
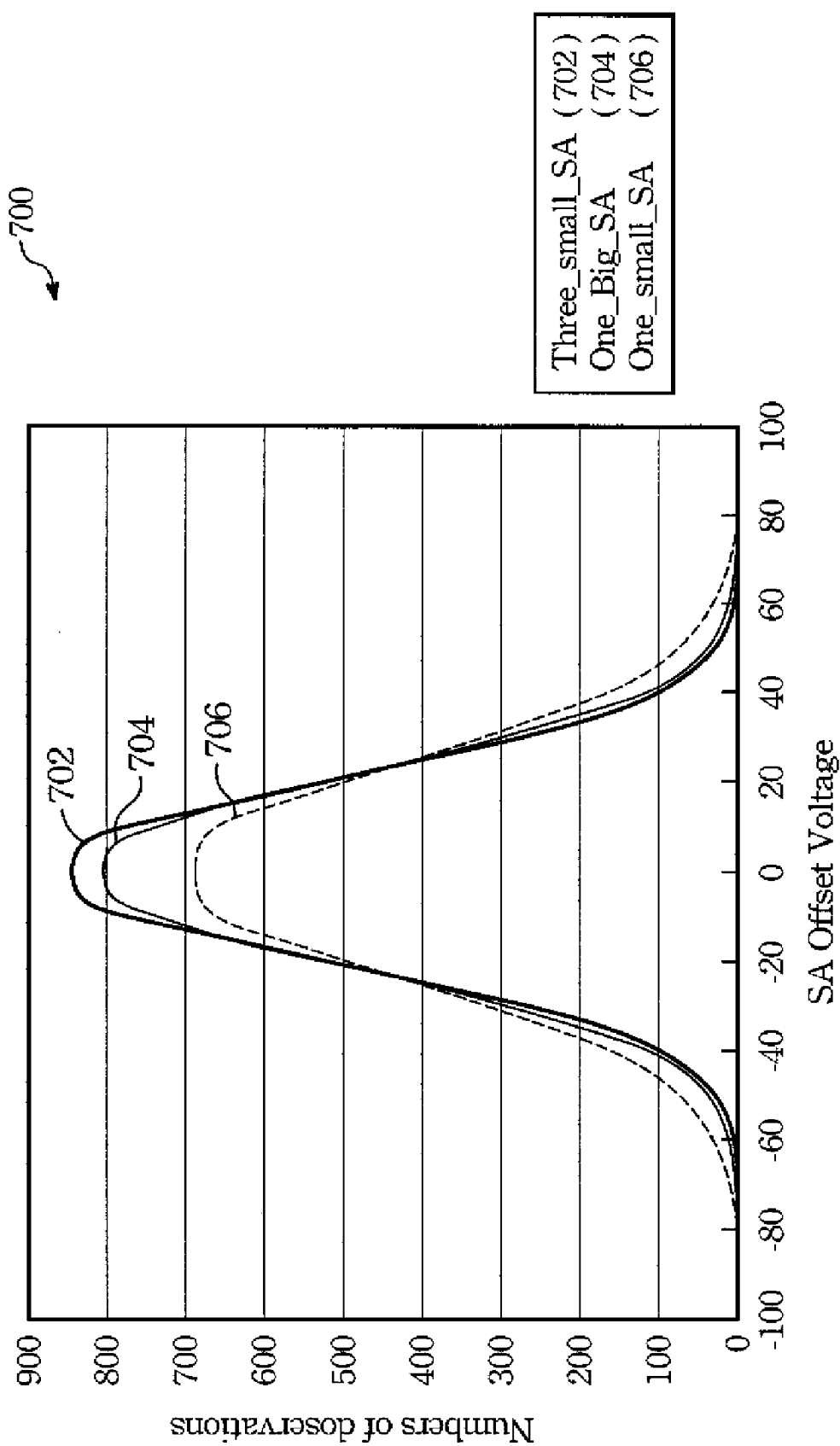
FIG. 7 illustrates distributions of offset voltages for the proposed differential sense amplifiers and the conventional differential sense amplifiers.

FIG. 7 illustrates the distributions of offset voltages for differential sense amplifiers of various sizes and configurations. Referring to FIGS. 5 and 7 simultaneously, the curve 706 shows the distribution of offset voltages for differential sense amplifiers of the same size such as SA-1, the curve 704 shows the distribution of offset voltages for differential sense amplifiers of the size equal to the combination of SA-1, SA-2 and SA-3, and the curve 702 shows the distribution of offset voltages for the unit 500 that include three small differential sense amplifiers SA-1, SA-2 and SA-3 operating under the Hamming operation methodology. As shown in the drawing, the curve 706 is flatter and wider than the curve 704, meaning that a single smaller differential sense amplifier has a higher failure probability than a single larger differential sense amplifier. Likewise, the curve 704 is flatter and wider than the curve 702, meaning that a differential sense amplifier has a higher failure probability than an equal-sized differential sense amplifier unit having three smaller amplifiers operating under the Hamming distance methodology. The probability that three small differential sense amplifiers fail at the same time is lower than the probability that a large sense amplifier triple the size of the small amplifier fails. In other words, if the expected failure probability of a single differential sense amplifier were set to be the same as that of an amplifier unit having three smaller differential sense amplifiers, the size of the amplifier unit would have been smaller than the large amplifier.

It is noted that the number of the differential sense amplifiers can exceed three for each amplifier unit. For example, each amplifier unit can include 2*n+1 differential sense amplifiers where n is a natural number, and the logic state of the Hamming output is determined by a majority logic state among those of the outputs from the (2*n+1) differential sense amplifiers.

One advantage of the present invention is that the proposed multiple differential sense amplifiers operated under the Hamming distance methodology do not require a testing process during an initial period of running an IC. This proposed amplifier unit does not need to select a signal differential sense amplifier for operation, as all outputs from the amplifiers within the unit are considered to generate a final output that represents an input received by the unit. As a result, no additional register is needed for storing the status of the individual differential sense amplifiers.

The disclosed invention also has the advantage of improving the reliability as the possibility of a plurality of differential sense amplifiers failing at the same time is lower than that of a single differential sense amplifier having the same layout area as the combination of the three smaller ones. In other words, if the reliability of one large differential sense amplifier and that of the proposed amplifier unit are held at the same level, the layout area of the proposed amplifier unit would be smaller than the conventional differential sense amplifier.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor device with a plurality of differential sense amplifiers, a unit of the differential sense amplifier comprising:
   a first differential sense amplifier coupled to an input signal including a first differential input signal and a second differential input signal for generating a first output;
   a second differential sense amplifier coupled to the input signal for generating a second output; and
   a third differential sense amplifier coupled to the input signal for generating a third output,
   wherein an output of the unit of the differential sense amplifier is determined based on combinations of logic states of the first, second, and third outputs.

2. The semiconductor device of claim 1 wherein the output of the unit of the differential sense amplifier is generated using Hamming distance methodology based on the combinations of logic states of the first, second and third outputs.

3. The semiconductor device of claim 2 wherein a logic state of the output of the unit of the differential sense amplifier is determined by a majority logic state among those of the first second and third outputs.

4. The semiconductor device of claim 3 wherein the output of the unit of the differential sense amplifier has a logic state of "1" if two or more logic states among those of me first, second and third outputs are "1."

5. The semiconductor device of claim 4 wherein the output of the unit of the differential sense amplifier has a logic state of "0" if two or more logic states among those of the first, second and third outputs are "0."

6. The semiconductor device of claim 2 further comprising a Hamming operation circuit for generating the output of the unit of the differential sense amplifier as an outcome of a formula: B*C+A*C+A*B+A*B*C, where A denotes the first output, B the second output, and C the third output.

7. The semiconductor device of claim 6 wherein the Hamming operation circuit comprises:
   a first AND gate having a first input terminal, a second input terminal, and a first output terminal, the first input terminal being coupled to the first output and the second input terminal being coupled to the second output;
   a second AND gate having a third input terminal, a fourth input terminal, and a second output terminal, the third input terminal being coupled to the second output and the fourth input terminal being coupled to the third output;
   a third AND gate having a fifth input terminal, a sixth input terminal, and a third output terminal, the fifth input terminal being coupled to the third output and the sixth input terminal being coupled to the first output; and
   an OR gate having a seventh input terminal coupled to the first output terminal of the first AND gate, an eighth input terminal coupled to the second output terminal of the second AND gate, a ninth input terminal coupled to the third output terminal of the third AND gate, and a fourth output terminal for generating the output of the unit of the differential sense amplifier.

8. The semiconductor device of claim 1 wherein the first, second and third differential sense amplifiers are made of a plurality of NMOS transistors and PMOS transistors.

9. A semiconductor device with a plurality of differential sense amplifiers, a unit of the differential sense amplifier comprising:
   (2*n+1) differential sense amplifiers coupled to an input signal including a first differential input signal and a second differential input signal for generating (2*n+1) outputs in response to the input signal, where n is a natural number; and
   at least one Hamming operation circuit coupled to the (2*n+1) differential sense amplifiers for generating a Hamming output amplifying the input signal based on combinations of logic states of the (2*n+1) outputs.

10. The semiconductor device of claim 9 wherein a logic state of the Hamming output is determined by a majority logic state among those of the (2*n+1) outputs.

11. The semiconductor device of claim 10 wherein the Hamming output has a logic state of "1" if majority logic states among those of the (2*n+1) outputs are "1."

12. The semiconductor device of claim 10 wherein the Hamming output has a logic state of "0" if majority logic states among those of the (2*n+1) outputs are "0."

13. The semiconductor device of claim 9 wherein n equals to 1 and the Hamming operation circuit for generating the Hamming output as an outcome of a formula: B*C+A*C+A*B+A*B*C*, where A denotes a first output from a first differential sense amplifier, B denotes a second output from a second differential sense amplifier, and C denotes a third output from a third differential sense amplifier.

14. The semiconductor device of claim 13 wherein the Hamming operation circuit comprises:
   a first AND gate having a first input terminal, a second input terminal, and a first output terminal, the first input terminal being coupled to the first output and the second input terminal being coupled to the second output;
   a second AND gate having a third input terminal, a fourth input terminal, and a second output terminal, the third input terminal being coupled to the second output and the fourth input terminal being coupled to the third output;
   a third AND gate having a fifth input terminal, a sixth input terminal, and a third output terminal, the fifth input terminal being coupled to the third output and the sixth input terminal being coupled to the first output; and
   an OR gate having a seventh input terminal coupled to the first output terminal of the first AND gate, a eighth input terminal coupled to the second output terminal of the second AND gate, a ninth input terminal coupled to the third output terminal of the third AND gate, and a fourth output terminal for generating the Hamming output.

15. The semiconductor device of claim 9 wherein the differential sense amplifiers we made of a plurality of NMOS transistors and PMOS transistors.

16. A semiconductor device with a plurality of differential sense amplifiers, a unit of the differential sense amplifier comprising:
   a first differential sense amplifier coupled to an input signal including a first differential input signal and a second differential input signal for generating a first output;
   a second differential sense amplifier coupled to the input signal for generating a second output;
   a third differential sense amplifier coupled to the input signal for generating a third output; and
   a Hamming operation circuit for determining an output of the unit of the differential sense amplifier based on a formula: $B*C+A*C+A*B+A*B*C*$, where A denotes the first output, B denotes the second output, and C denotes the third output.

17. The semiconductor device of claim 16 wherein the output of the unit of the differential sense amplifier has a logic state of "1" if two or more logic states among those of the first second and third outputs are "1."

18. The semiconductor device of claim 16 wherein the output of the unit of the differential sense amplifier has a logic state of "0" if two or more logic states among those of the first, second and third outputs are "0."

19. The semiconductor device of claim 16 where the Hamming operation circuit comprises:
   a first AND gate having a first input terminal, a second input terminal, and a first output terminal, the first input terminal being coupled to the first output and the second input terminal being coupled to the second output;
   a second AND gate having a third input terminal, a fourth input terminal, and a second output terminal, the third input terminal being coupled to the second output and the fourth input terminal being coupled to the third output;
   a third AND gate having a fifth input terminal, a sixth input terminal, and a third output terminal, the fifth input terminal being coupled to the third output and the sixth input terminal being coupled to the first output; and
   an OR gate having a seventh input terminal coupled to the first output terminal of the first AND gate, a eighth input terminal coupled to the second output terminal of the second AND gate, a ninth input terminal coupled to the third output terminal of the third AND gate, and a fourth output terminal for generating the output of the unit of the differential sense amplifier.

20. The semiconductor device of claim 16 wherein the first, second and third differential sense amplifiers are made of a plurality of NMOS transistors and PMOS transistors.

* * * * *